(12) United States Patent
Fujiwara et al.

(10) Patent No.: US 6,917,065 B2
(45) Date of Patent: Jul. 12, 2005

(54) FERROELECTRIC CAPACITOR AND SEMICONDUCTOR DEVICE

(75) Inventors: Tetsuo Fujiwara, Hitachinaka (JP);
Toshihide Nabatame, Hitachi (JP);
Takaaki Suzuki, Hitachinaka (JP);
Kazutoshi Higashiyama, Naka-machi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/681,173

(22) Filed: Oct. 9, 2003

(65) Prior Publication Data

US 2004/0075126 A1 Apr. 22, 2004

Related U.S. Application Data

(63) Continuation of application No. 10/229,075, filed on Aug. 28, 2002, now abandoned, which is a continuation of application No. 09/486,233, filed as application No. PCT/JP98/04259 on Sep. 22, 1998, now abandoned.

(51) Int. Cl.[7] .............................................. H01L 29/06
(52) U.S. Cl. .................. 257/303; 257/295; 257/298; 257/300; 257/306; 257/309; 257/310
(58) Field of Search ................................ 257/295, 298, 257/300, 303, 306, 309, 310

(56) References Cited

U.S. PATENT DOCUMENTS

| | | | |
|---|---|---|---|
| 5,508,953 A | * 4/1996 | Fukuda et al. | ............... 365/145 |
| 5,793,600 A | 8/1998 | Fukuda et al. | |
| 6,111,284 A | 8/2000 | Sakurai | |
| 6,194,228 B1 | 2/2001 | Fujiki et al. | |
| 6,291,291 B1 | 9/2001 | Noshiro | |
| 6,320,213 B1 | 11/2001 | Kirlin et al. | |
| 6,333,066 B1 | 12/2001 | Kim | |
| 6,338,994 B1 | 1/2002 | Torii et al. | |
| 6,340,621 B1 | 1/2002 | Anderson et al. | |
| 6,351,006 B1 | 2/2002 | Yamakawa et al. | |
| 6,396,092 B1 | * 5/2002 | Takatani et al. | ............ 257/295 |
| 6,407,422 B1 | 6/2002 | Asano et al. | |
| 6,462,931 B1 | * 10/2002 | Tang et al. | ................. 361/305 |
| 2002/0180045 A1 | 12/2002 | Zhang et al. | |

FOREIGN PATENT DOCUMENTS

WO    WO 9844551 A1 * 10/1998  ....... H01L/21/8242

* cited by examiner

*Primary Examiner*—Minhloan Tran
*Assistant Examiner*—Thomas L Dickey
(74) *Attorney, Agent, or Firm*—Antonelli, Terry, Stout & Kraus, LLP

(57) ABSTRACT

A ferroelectric capacitor of the type having a top electrode, a ferroelectric thin film, and a bottom electrode, is characterized in that said ferroelectric thin film is a perovskite-type oxide containing Pb and said upper and bottom electrodes contain an intermetallic compound composed of Pt and Pb. An electronic device is provided with said ferroelectric capacitor. This construction is designed to solve the following problems. In a non-volatile ferroelectric memory (FeRAM), a degraded layer occurs near the interface between the PZT and the electrode due to hydrogen evolved during processing or due to diffusion of Pb from the PZT into the electrode. A stress due to a difference in lattice constant occurs in the interface between the electrode and the ferroelectric thin film. The degraded layer and the interfacial stress deteriorate the initial polarizing characteristics of the ferroelectric capacitor and also greatly deteriorate the polarizing characteristics after switching cycles.

17 Claims, 13 Drawing Sheets

F I G. 1
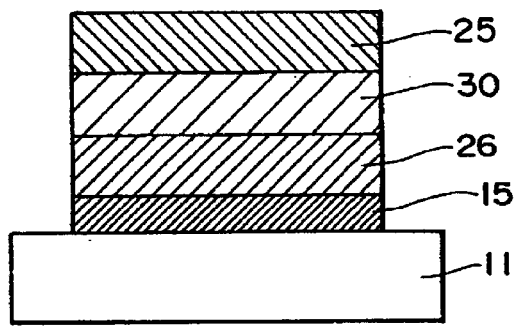
F I G. 2
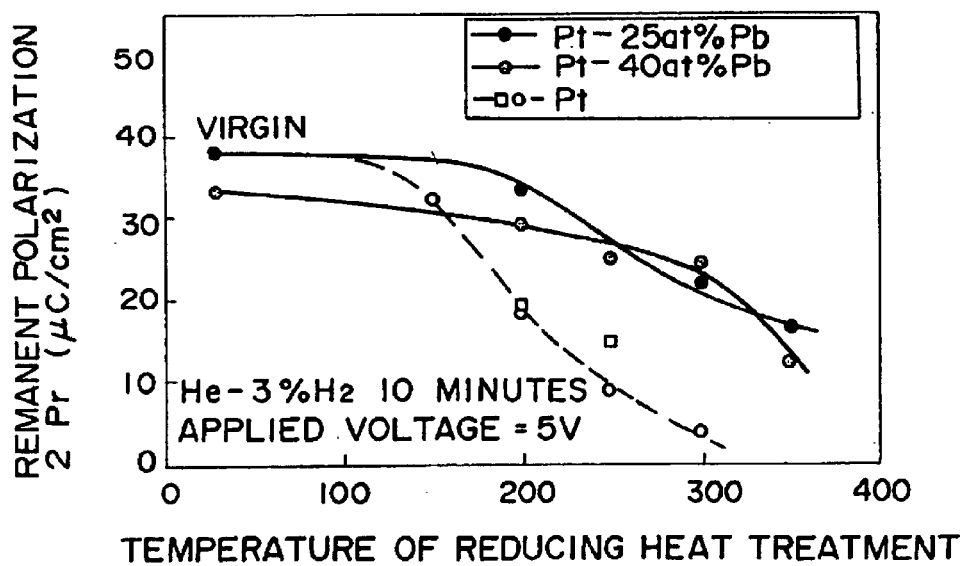

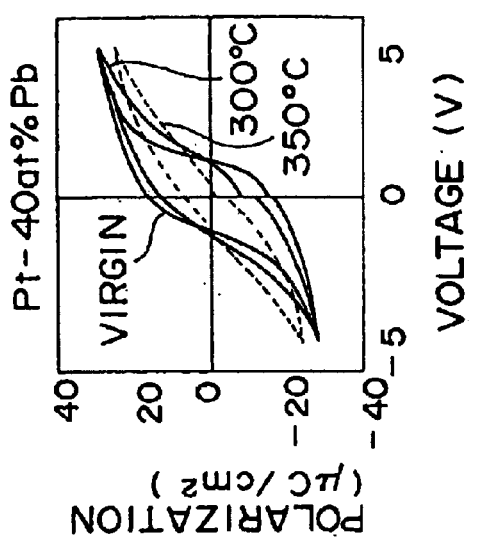
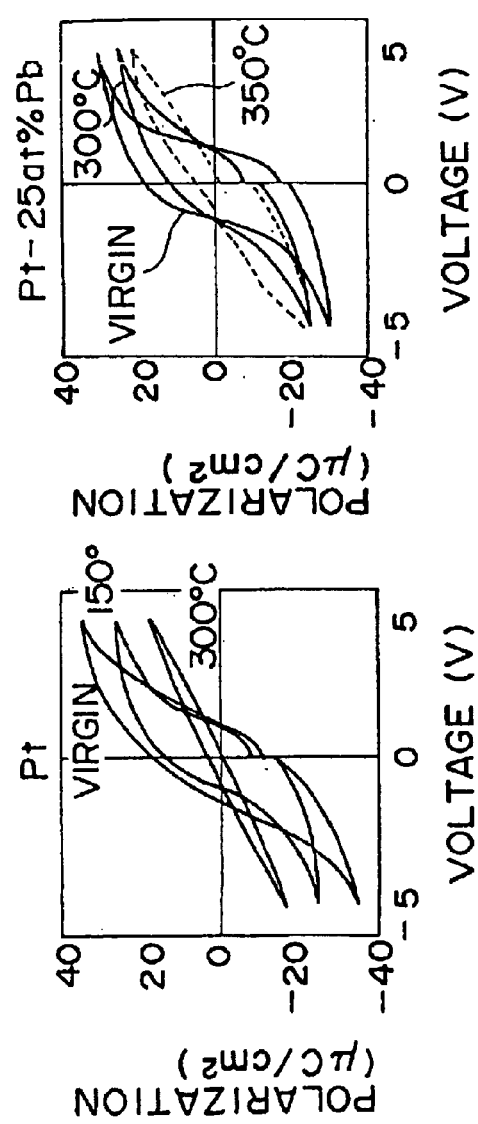
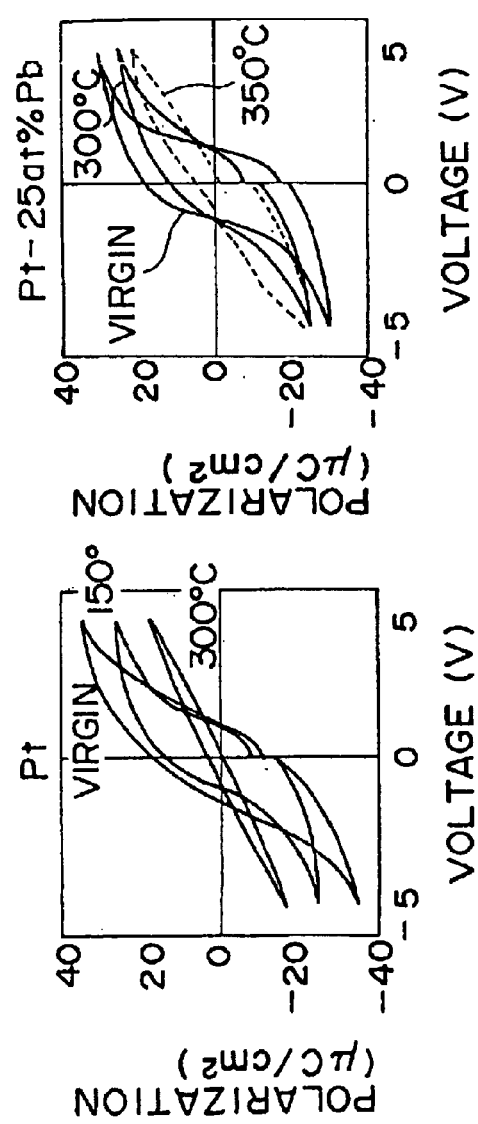

Pt (FCC)

Pt3Pb (L12) TYPE

PZT (PEROVSKITE TYPE)

FERROELECTRIC CAPACITOR AND SEMICONDUCTOR DEVICE

CROSS-REFERENCE TO RELATED APPLICATIONS

This application is a Continuation application of application Ser. No. 10/229,075, filed Aug. 28, 2002 now abandoned which is a Continuation application of application Ser. No. 09/486,233, filed Apr. 24, 2001 now abandoned, which is the National Stage of International Application No. PCT/JP98/04259, filed Sep. 22. 1998, the entire disclosure of which is hereby incorporated by reference.

TECHNICAL FIELD

The present invention relates to a ferroelectric capacitor. More particularly, the present invention relates to a ferroelectric capacitor which is suitable for use in a semiconductor device typified by a non-volatile ferroelectric memory (FeRAM), a system LSI with a nonvolatile memory, and DRAM which employs ferroelectrics as the capacitor.

BACKGROUND OF THE INVENTION

A ferroelectric memory has been said to be an ideal memory because of its outstanding characteristic property of a high access speed comparable to that of a DRAM, and yet it is non-volatile and capable of operating with a lower power consumption. It has a capacitor of ferroelectric material such as $Pb(Zr_xTi_{1-x})O_3$ (PZT) and $SrBi_2Ta_2O_9$ (SBT) which are oxides with a perovskite-type crystal structure, so that it records information by means of the direction of its remanent polarization.

The ferroelectric oxide needs in its production a process of heat treatment for crystallization in an oxygen atmosphere which is carried out after its thin film has been formed. Consequently, the electrodes through which electrical signals are transmitted to the ferroelectric thin film as a capacitor are made of a noble metal, such as Pt and Ir, which is chemically stable and resistant to oxidation and deterioration at high temperature during heat treatment. For example, Japanese Patent Laid-open No. Hei 9-102590 discloses a ferroelectric capacitor composed of PZT (for the ferroelectric thin film) and Pt (for the electrode).

SUMMARY OF THE INVENTION

The above-mentioned prior art technology pays no attention to the problem that the polarizing characteristics of ferroelectrics tend to deteriorate due to hydrogen evolved in the process which is carried out after the capacitor has been formed. This hydrogen is evolved in the step of passivation (to form an insulating protective film) and in the step of packaging. It is known that hydrogen greatly deteriorates the polarizing characteristics of the ferroelectric capacitor. If the top electrode is made of platinum, hydrogen is decomposed into active hydrogen due to platinum's catalytic action. Active hydrogen reaches the interface between the top electrode and the ferroelectric thin film and combines with oxygen in the ferroelectric thin film. This results in an oxygen-poor degraded layer near the interface between the ferroelectric thin film and the electrode, and this layer greatly deteriorates the polarizing characteristics.

In addition, the above-mentioned prior art technology has both an advantage and a disadvantage. It protects the electrode material from oxidation during the heat treatment in an oxygen atmosphere to form an oxide of the ferroelectric material. On the other hand, it permits the constituting elements to diffuse from the ferroelectric oxide to the electrode material in the step of heat treatment. As mentioned above, the ferroelectric thin film lacks oxygen in the stage immediately after film forming and hence is in an unstable crystalline state. Therefore, it needs heat treatment for crystallization so as to supply oxygen which stabilizes the crystalline state. This heat treatment for crystallization should be carried out at about 500–800° C. in order to provide a ferroelectric capacitor having satisfactory polarizing characteristics. During this heat treatment, metal elements constituting the ferroelectric oxide diffuse from the ferroelectric thin film to the bottom electrode, forming a deteriorated layer (or a small region with varied compositions) near the interface between the ferroelectric thin film and the bottom electrode. A ferroelectric capacitor composed of PZT (for the ferroelectric thin film) and Pt (for the electrode) poses a problem in that Pb in the PZT diffuses into Pt in the bottom electrode during heat treatment for crystallization, resulting in a Pb-poor degraded layer near the interface between the PZT film and the electrode. This degraded layer deteriorates the initial polarizing characteristics of the ferroelectric capacitor and it also greatly deteriorates the polarizing characteristics after the ferroelectric capacitor polarizes and inverses repetitiously in the course of memory switching.

Moreover, the above-mentioned prior art technology has another disadvantage in that PZT and Pt differ so greatly in lattice constant that there exists a stress due to lattice deformation near the interface. This stress also deteriorates the polarizing characteristics.

The present invention was completed in view of the foregoing problems. It is an object of the present invention to prevent the formation of the degraded layer in the ferroelectric thin film of a ferroelectric memory.

It is another object of the present invention to provide an electrode material which reduces stress at the interface between the ferroelectric thin film and the electrode.

It is still another object of the present invention to provide a ferroelectric memory which has outstanding polarizing characteristics and is less liable to deterioration after repeated use.

The first aspect of the present invention resides in a ferroelectric capacitor of the type having a top electrode, a ferroelectric thin film, and a bottom electrode, characterized in that said ferroelectric thin film is a perovskite-type oxide containing a metal element and said top electrode contains an intermetallic compound composed of said metal element and a noble metal.

The second aspect of the present invention resides in a ferroelectric capacitor of the type having a top electrode, a ferroelectric thin film, and a bottom electrode, characterized in that said ferroelectric thin film is a perovskite-type oxide containing a metal element and said top electrode and bottom electrode contain an intermetallic compound composed of said metal element and a noble metal.

The third aspect of the present invention resides in a ferroelectric capacitor of the type having a top electrode, a ferroelectric thin film, and a bottom electrode, characterized in that said ferroelectric thin film is a perovskite-type oxide containing a metal element, and at least either of said top electrode or said bottom electrode has a multilayer structure formed by sequentially laminating a layer containing an intermetallic compound composed of said metal element and a noble metal and a layer of said noble metal, the former being adjacent to the interface of the ferroelectric thin film.

The fourth aspect of the present invention resides in a ferroelectric capacitor of the type having a substrate, a buffer layer, a bottom electrode, and a ferroelectric thin film, which are sequentially laminated, characterized in that said buffer layer is made of a transition metal or a nitride thereof, said ferroelectric thin film is made of a perovskite-type oxide containing a metal element, and said bottom electrode contains an intermetallic compound composed of said metal element and a noble metal.

The fifth aspect of the present invention resides in a ferroelectric capacitor as defined above, in which said noble metal is Pt, said intermetallic compound is one which is composed of Pb and Pt, with the Pb content being 40 atom % or less, and said transition metal is Ti.

FIG. 15 is an equilibrium diagram of the Pt—Pb binary system (taken from the Metal Data Book compiled by the Japan Institute of Metals, 3rd edition, p.580, published by Maruzen, 1993). This diagram shows that Pt does not dissolve in Pb in their equilibrium state. Therefore, as Pb is added to Pt. there occurs a two-phase structure composed of Pb-free Pt and an intermetallic compound $Pt_3Pb$ having the $L1_2$ type crystal structure. When the amount of Pb reaches 25 atom %, there occurs a single-phase structure of $Pt_3Pb$. This is the intermetallic compound composed of Pt and Pb (with the Pb content being 40 atom % or less) mentioned in the present invention. The phase structure shown in the diagram of the equilibrium state (FIG. 15) does not necessarily occur in the case of a thin film material as in the present invention. Therefore, it is desirable that the intermetallic compound composed of Pt and Pb (with the Pb content 40 atom % or less) should also include a structure which is not shown in the diagram of the equilibrium state.

In accordance with the present invention, said intermetallic compound will be as effective as the $Pt_3Pb$ intermetallic compound so long as it has the phase of a crystal structure of a face centered cubic lattice even though it has another crystal structure than that of the $L1_2$ type.

In the following description, the Pt—Pb intermetallic compound denotes an intermetallic compound composed of Pt and Pb, with the Pb content being 40 atom % or less.

According to the present invention, the bottom electrode layer has the crystal structure of a face centered cubic lattice, with its major orientation being (111) or (100) or (110). In addition, both the ferroelectric thin film and the bottom electrode have a major orientation of (111) or (100) or (110). Incidentally, the terms "strongly oriented", "high orientation", and "major orientation" have the same meaning in this specification.

The ferroelectric capacitor according to the present invention is characterized in that the bottom electrode is of multilayer structure, with the first layer being made of a metal having a face centered cubic lattice and the second layer being made of an alloy containing said metal and having a basic crystal structure of a face centered cubic lattice, the first and second layers having lattice constants whose difference is 3.5% or less. In addition, the ferroelectric capacitor should preferably be characterized in that at least either of the top electrode or the bottom electrode has a basic crystal structure of a face centered cubic lattice, with the bottom electrode and the ferroelectric thin film having lattice constants whose difference is 1% or less.

In addition, according to the present invention, the ferroelectric thin film has a thickness of 1000 Å or less.

A mention is made below of the function which is produced when the top electrode is made of the Pt—Pb intermetallic compound specified in the present invention. The top electrode is formed after the ferroelectric thin film has undergone heat treatment for crystallization; therefore, the top electrode has no adverse effect on the ferroelectric thin film during heat treatment for crystallization. On the other hand, the polarization of the ferroelectric capacitor is greatly affected by hydrogen which is evolved in the steps of passivation (to form insulating protective film) and packaging in the LSI manufacturing process. If the top electrode is made of platinum, platinum catalytically decomposes hydrogen into active hydrogen, and this active hydrogen reaches the interface between the top electrode and the ferroelectric thin film and combines with oxygen in the ferroelectric thin film. As a result, an oxygen-poor degraded layer appears near the interface between the ferroelectric thin film and the electrode, and this degraded layer greatly aggravates the polarizing characteristics. If there is a large mismatch of lattice constant between the top electrode and the ferroelectric thin film, a lattice distortion occurs near the interface between the top electrode and the ferroelectric thin film. This lattice distortion also aggravates the polarizing characteristics. As compared with pure platinum, the Pt—Pb intermetallic compound specified in the present invention is less capable of decomposing molecular hydrogen into active hydrogen. Therefore, the top electrode made of this intermetallic compound protects the ferroelectric thin film from being attacked by active hydrogen. Also, the $Pt_3Pb$ intermetallic compound has a lattice constant close to that of PZT (or the ferroelectric thin film); therefore, the top electrode made of this intermetallic compound greatly reduces stress due to lattice distortion that occurs near the interface between the top electrode and the ferroelectric thin film. In addition, the top electrode made of a Pt—Pb intermetallic compound-prevents Pb in PZT from diffusing into the electrode (and hence prevents a degraded layer from forming in the PZT) during the heat treatment which is carried out after the top electrode has been made. The Pr—Pb intermetallic compound should contain Pb in an amount of 50 atom % or less; otherwise, it has a low melting point and adversely affects the film shape after heat treatment. Owing to the above-mentioned effect, the top electrode made of the Pt—Pb intermetallic compound yields a ferroelectric capacitor which is superior in polarizing characteristics and is almost exempt from deterioration.

A mention is made below of the function which is produced by the bottom electrode made of the Pt—Pb intermetallic compound specified in the present invention.

As mentioned above, according to the present invention, the ferroelectric thin film of perovskite-type oxide containing Pb (as represented by PZT) is held between electrodes made of the Pt—Pb intermetallic compound.

The ferroelectric thin film is formed by sputtering, sol-gel method, or CVD on the lower electrode, which is formed on a substrate. In the stage immediately after forming the ferroelectric thin film, the ferroelectric thin film is incomplete in crystallinity on account of insufficient oxygen. In order to convert the ferroelectric thin film into a stable one, it should undergo heat treatment for crystallization in an oxygen-containing atmosphere. The temperature of this heat treatment varies depending on the ferroelectric substance. It ranges from about 600° C. to about 800° C. in the case of PZT. This high temperature region has never been experienced in the conventional silicon process. If this heat treatment for crystallization oxidizes the bottom electrode, the bottom electrode becomes poor in electrical conductivity and decreases in adhesion strength to such an extent that the ferroelectric thin film peels off. Therefore, the bottom electrode should be made of a substance superior in oxidation resistance. For this reason, the electrode is made of an alloy composed mainly of. Pt in accordance with the present invention.

The bottom electrode made of the Pt—Pb intermetallic compound according to the present invention effectively prevents Pb from diffusing from PZT into the electrode and hence prevents a degraded layer from forming in the ferroelectric thin film. (In the conventional technology, however, the electrode made of pure platinum causes Pb to diffuse from PZT into the platinum electrode during heat treatment for crystallization, giving rise to a degraded layer of unstable composition in the ferroelectric thin film and aggravating the polarizing characteristics.) Diffusion of a metal element across different phases is caused by the chemical potential difference, which is a function of the difference in concentration of the diffusing element. In the case of diffusion of Pb, the driving force of diffusion is decreased if Pb is previously contained in the electrode into which diffusion proceeds so that the difference in Pb concentration is small between the PZT and the electrode. In this case the amount of Pb contained in the electrode should be 50 atom % or less. With a Pb content higher than this limit, the electrode has a lower melting point and melts during heat treatment, producing an adverse effect on the smoothness and fine structure of the ferroelectric thin film. In actual practice, the amount of element diffusion depends on temperature and time in addition to the driving force. Fortunately, the heat treatment for crystallization is completed in a short time (several minutes). This short time does not affect diffusion so long as the difference in Pb concentration is small between the PZT and the electrode There is a conceivable way of forming Pb-rich PZT in anticipation of Pb diffusion into the Pt electrode. However, diffusion does occur in this case and hence the composition varies in the platinum electrode from its interface to its inside. If there is a concentration gradient in the vertical direction across the ferroelectric thin film, the polarization characteristics are greatly aggravated after switching cycles even though it is good in the initial stage. In addition, it is difficult to find the optimum composition before diffusion, and it is also, very difficult to control the PZT composition after heat treatment for crystallization. By contrast, according to the present invention, Pb is previously contained in the platinum electrode, so that it is possible to establish an optimum PZT composition in the beginning. This is advantageous from the standpoint of controlling the PZT composition.

Since the bottom electrode is made of a Pt—Pb intermetallic compound, there is only a small difference in lattice constant between the PZT and the bottom electrode. This contributes to a high-quality ferroelectric film owing to reduction in stress induced by lattice distortion at the interface. A conspicuous effect is produced when a $Pt_3Pb$ intermetallic compound of $L1_2$ crystal structure is used. Examples of the $L1_2$ crystal structure are shown in FIGS. 16(a) to 16(c). It is based on a face centered cubic (FCC) lattice with regular atom arrangement. In the figures, 101 denotes a Pt atom, 102 denotes a Pb atom, and 105 denotes a Ti atom or Zr atom. The $Pt_3Pb$ having the $L1_2$ type crystal structure as shown in FIG. 16(b) has a lattice constant of 4.058 Å according to P. Villars and L. D. Calvert, "Pearson's Handbook of Crystallographic Data for Intermetallic Phases" ASM International, (1991). This value is very close to the lattice constant of PZT of perovskite-type crystal structure shown in FIG. 16(c), which is 4.036 Å according to K. Kakegawa et al., Solid State Commun., 24, 769 (1977), rather than the lattice constant of 3.92 Å of Pt of FCC shown in FIG. 16(a). The difference in lattice constant is 0.55%. As a result, the PZT thin film formed on the $Pt_3Pb$ has less lattice strain than that formed directly on Pt; and therefore, it is of high quality with very little stress. In addition, as mentioned above, the difference in lattice constant between the bottom electrode and the PZT is 1% or less, and the PZT is formed with an orientation similar to that of the bottom electrode. In this case, it is apparent that the effect of preventing the diffusion of Pb (as mentioned above) can be obtained at the same time. The PZT thin film with a high orientation, which is free of interfacial stress and a degraded layer, contributes to provision of a ferroelectric capacitor with outstanding polarizing characteristics.

In addition, in order to obtain the outstanding polarizing characteristics, it is suitable to form the ferroelectric thin film with an orientation. This object is effectively achieved by forming the bottom electrode with an orientation. It is known that the Pt bottom electrode formed on a Ti or TiN buffer layer on a silicon single crystal substrate tends to strongly orient in the (111) plane and the PZT also orients in the (111) plane under this influence. The orientation of Pt in the (111) plane depends on the crystal structure and lattice constant of Pt and Ti. The Pt—Pb intermetallic compound according to the present invention does not greatly differ from platinum in crystal structure and lattice constant; therefore, a bottom electrode made of it in place of platinum can be oriented mainly in the (111) plane when formed on the Ti buffer layer. As mentioned above, the difference in lattice constant between the Pt—Pb intermetallic compound and PZT is smaller than that between Pt and PZT. Therefore, the PZT formed on the bottom electrode of Pt—Pb which orients mainly in the (111) plane has a higher orientation than the PZT formed on the bottom electrode of the Pt intermetallic compound. It is possible to effectively achieve the orientation of PZT if a laminate is formed on a silicon single-crystal substrate from a Ti buffer layer, a first bottom electrode layer of Pt, a second bottom electrode layer of Pt—Pb intermetallic compound, and a PZT ferroelectric thin film. In this case, the first bottom electrode layer of Pt certainly orients on the Ti buffer layer; therefore, the second bottom electrode of Pt—Pb intermetallic compound has a higher degree of orientation. Epitaxial growth on the oriented bottom electrode yields a high-quality ferroelectric thin film of PZT with high orientation and low stress at the interface. This leads to the outstanding polarizing characteristics.

On the other hand, if another layer (such as a diffusion barrier layer) is formed between the Ti buffer layer and the bottom electrode layer, the orientation of the Ti buffer layer does not transmit directly to the bottom electrode layer of Pt—Pb intermetallic compound or the first bottom electrode layer of Pt. Therefore, the bottom electrode does not have a high degree of orientation. In other words, the PZT ferroelectric thin film does not highly orient and hence does not have outstanding polarizing characteristics.

According to the present invention, the bottom electrode is composed of layers of the crystal structure of a face centered cubic lattice so as to achieve the desired orientation. In this way, the PZT ferroelectric thin film can be formed with an orientation. In addition, in order to enhance the orientation of the ferroelectric thin film, it is necessary to form a first layer of the bottom electrode and subsequently a second layer of the bottom electrode. The first layer is made of a metal having a face centered cubic lattice structure which certainly orients on the buffer layer. The second layer has the function of preventing diffusion and reducing interfacial stress. The second layer of the bottom electrode should be made of an alloy having a face centered cubic lattice structure or a crystal structure based on the face centered cubic lattice structure and also containing a metal element constituting the first layer of the bottom electrode. Moreover, the difference in lattice structure between the first layer and the second layer should be 3.5% or less. These conditions are necessary for the electrode as a whole to have a high degree of orientation and for the ferroelectric thin film to have a high degree of orientation. In addition, if the difference in lattice constant between the ferroelectric thin film and the bottom electrode is 1% or less, the orientation of the ferroelectric thin film is enhanced under the influence of the oriented atom arrangement in the bottom electrode. In this case, there is only a small strain in the interface between the bottom electrode and the ferroelectric thin film, and this effectively prevents deterioration due to repeated polarization and inversion.

As mentioned above, the present invention provides a ferroelectric capacitor which has a high degree of polarization and resists deterioration caused by repetitious switching.

BRIEF DESCRIPTION OF THE DRAWINGS

FIG. 1 is a sectional view of a ferroelectric capacitor representing one example of the present invention.

FIG. 2 is a diagram showing how the ferroelectric capacitor in one example of the present invention deteriorates in polarization due to reducing heat treatment differently depending of the top electrode.

FIGS. 3(a), 3(b) and 3(c) are diagrams showing how the ferroelectric capacitor in one example of the present invention varies in hysteresis curve depending on the temperature of the reducing heat treatment.

BEST MODE FOR CARRYING OUT THE INVENTION

Figure 4:
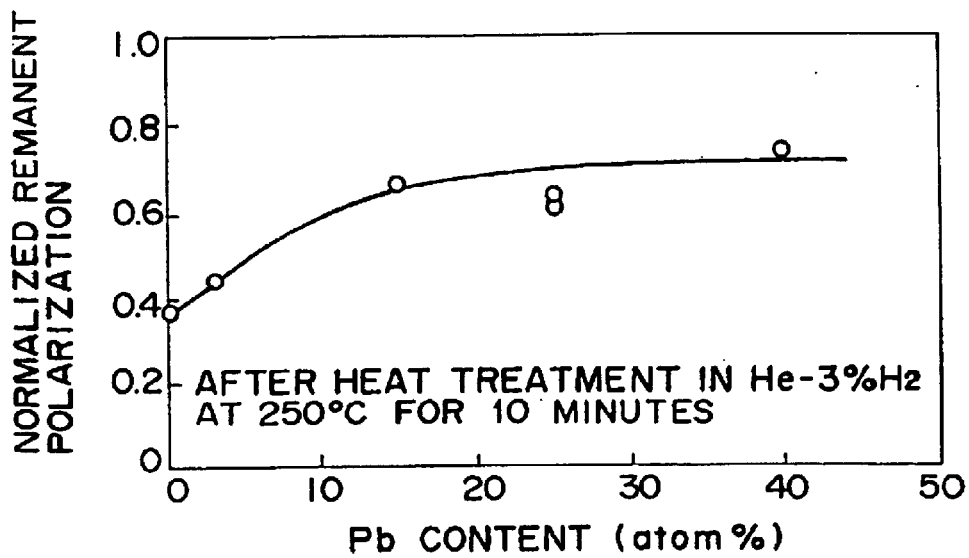
FIG. 4 is a graph showing how the remanent polarization value before and after the reducing heat treatment varies depending on the Pb composition of the top electrode.

The invention will be described in more detail with reference to the accompanying drawings. Reference numerals are used in the drawings to denote the parts listed below. 11: substrate, 15: buffer layer, 16: bottom electrode, 17: upper layer, 20: bottom electrode of Pt—Pb intermetallic compound, 21: first layer of bottom electrode of Pt, 23: second layer of bottom electrode of Pt$_3$Pb, 25: top electrode of Pt—Pb intermetallic compound, 26: bottom electrode of Pt, 27: top electrode of Pt, 30: ferroelectric thin film of PZT, 40: first layer of top electrode of Pt$_3$Pb, 44: second layer of top electrode of Pt, 61: Si substrate, 62: SiO$_2$ layer, 67: source, 68 drain, 69 metal layer, 71: top electrode, 73: bottom electrode, 75: ferroelectric thin film, 77: buffer layer, 79: substrate, 101: Pt atom, 102: Pb atom, 105; Ti or Zr atom, 110: oxygen atom, 210: contactless type IC card, 202: transmitting and receiving apparatus, 203: data exchange-apparatus, 204: microcomputer chip with built-in memory, 205 antenna coil, 206: ferroelectric memory element, 207 data.

EXAMPLE 1

FIG. 1 is a schematic sectional view of the ferroelectric capacitor according to the present invention. The substrate 11 is a silicon wafer substrate having an SiO$_2$ layer formed by thermal oxidation. The buffer layer 15 is a Ti layer (200 Å thick) formed by sputtering, with the substrate heated at 300° C. The bottom electrode 26 is a Pt layer (1700 Å thick) formed by sputtering, with the substrate heated at 300° C.

The ferroelectric thin film 30 is a thin film (ca. 2500 Å thick) formed by sputtering from PZT having a composition of Pb(Zr$_{0.52}$Ti$_{0.48}$)O$_3$, with the substrate heated at 300° C. The substrate with deposited layers undergoes heat treatment for crystallization. This heat treatment is rapid thermal annealing (RTA) at 650° C. for 2 minutes in an atmosphere with a low oxygen concentration. It was found by X-ray diffraction that the resulting PZT film is highly oriented mostly in the (111) plane.

In this example, the top electrode 25 is formed by sputtering from the Pt—Pb intermetallic compound specified in the present invention. Sputtering was carried out using a binary sputtering apparatus capable of manipulating two targets of Pt and Pb simultaneously and controlling the sputtering speeds independently for the respective targets. The top electrode 25 is 1700 Å thick. Several top electrodes were prepared which vary in the Pb composition from 0 atom % to 40 atom % in order to find a range of Pb composition which is most effective in preventing deterioration due to hydrogen reduction. While the top electrode is being formed, the substrate was kept at room temperature or 300° C. The resulting top electrode film contains the phase of Pt$_3$Pb intermetallic compound of Pb accounts for at least 10% in the Pb composition. (This was confirmed by XRD.) After the top electrode had been formed, the second annealing (oxygen heat treatment) was conducted in order to remove damages to the PZT thin film. In addition, in order to evaluate the characteristics of hydrogen deterioration, reducing heat treatment was conducted-in an atmosphere of He-3% H2. Before and after, this heat treatment, the ferroelectric capacitor was examined for a hysteresis curve (or polarization-voltage curve) characteristics.

FIG. 2 is a diagram showing how the value of remanent polarization varies depending on the temperature of reducing heat treatment in the case where the upper layer is made of Pt, Pt-25 atom % Pb, and Pt-40 atom % Pb. In the case of the top electrode made of Pt (as a comparative example), the value of remanent polarization decreases when the temperature of reducing heat treatment exceeds 150° C., and it becomes almost null (or ferroelectric characteristics disappear) when the temperature of the reducing heat treatment exceeds 300° C. In the case of the top electrode made of Pt-25 atom % Pb or Pt-40 atom % Pb, the polarizing characteristics remain almost intact even when the temperature of the reducing heat treatment exceeds 350° C.

FIGS. 3(a), 3(b) and 3(c) show hysteresis curves of the three top electrodes mentioned above. The top electrode of Pt (in the comparative example) gives an almost straight line after heat treatment at 300° C., as shown in FIG. 3(a). By contrast, the top electrode of Pt-25 atom % Pb or Pt-40 atom % Pb does not greatly change in hysteresis characteristics after heat treatment at 300° C., as shown in FIGS. 3(b) and 3(c). This result suggests that the top electrode of Pt—Pb according to the present invention is less subject to the platinum's catalytic action.

FIG. 4 shows the relation between the remanent polarization after reducing heat treatment at 250° C. for 10 minutes and the Pb composition of the top electrode made of Pt—Pb. The ordinate represents the normalized value of the remanent polarization determined before the top electrode undergoes reducing heat treatment. It is noted that hydrogen deterioration decreases as the amount of Pb increases in the Pt—Pb for the top electrode. The effect is conspicuous when the content of Pb is 10% or more. It is concluded, therefore, that the content of Pb in the Pt—Pb top electrode should preferably be 10% or more from the standpoint of resistance to reduction.

Figure 5:
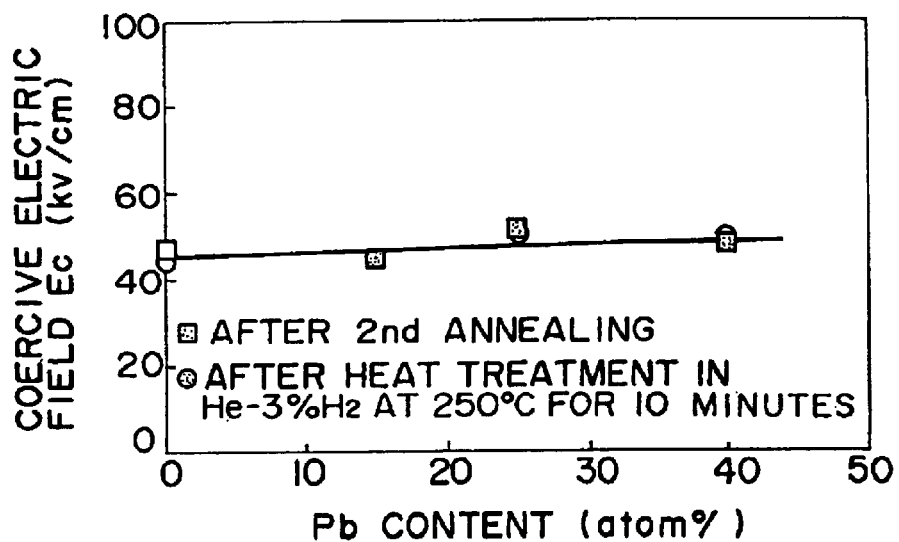
FIG. 5 is a graph showing how the value of coercive electric field in one example of the present invention depends on the Pb composition of the top electrode.

FIG. 5 shows how the ferroelectric capacitor in one example of the present invention varies in coercive electric field (Ec) depending on the Pb composition of the Pt—Pb top electrode. When a new material is employed as the upper electrode to prevent deterioration by hydrogen, there is a probability that the coercive electric field increases because of a work function problem between the new material and a ferroelectric material. As the coercive electric field increases, the voltage to bring about polarization also increases. This is not desirable when the ferroelectric capacitor is used as a memory. As compared with the conventional Pt top electrode, the Pt—Pb top electrode in this example does not greatly vary in coercive electric field even though its Pb content increases; it keeps an adequate value for memory driving. In FIG. 5, the □ mark denotes the value after oxygen treatment carried out to remove damage, and the ○ mark denotes the value after reducing heat treatment in an atmosphere of He-3% H at 250° C. for 10 minutes.

Figure 6:
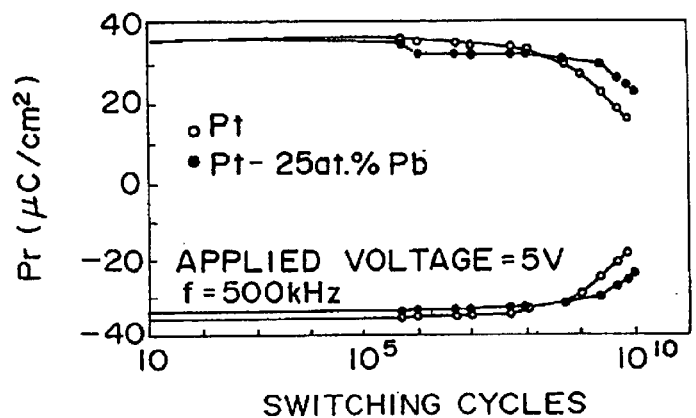
FIG. 6 is a graph showing how the film fatigue characteristics in one example of the present invention depends on the top electrode.

FIG. 6 shows the result of evaluation of the fatigue characteristics of the ferroelectric capacitor in this example. The evaluation was carried out by switching cycles (5V, 500 kHz), and the remanent polarization Pr was observed. In FIG. 6, the ● mark denotes the result of the Pt-25 atom % Pb (Pt₃Pb) top electrode in this example, and the ○ mark denotes the result of the Pt top electrode in the comparative example. It is noted that as compared with the comparative sample, the sample in this example is less liable to deterioration in polarization characteristics due to repeated polarization and inversion and hence has better film fatigue characteristics.

Figure 7A:
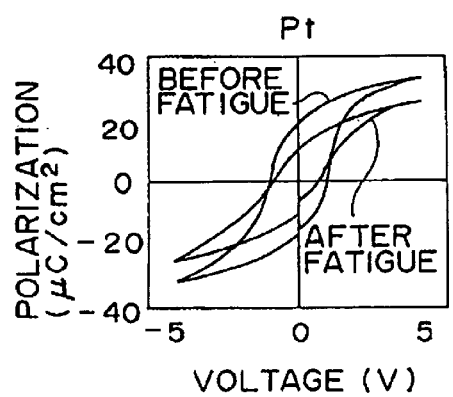
FIGS. 7(a) and 7(b) are graphs showing a hysteresis curve before and after the fatigue test in one example of the present invention.
Figure 7B:
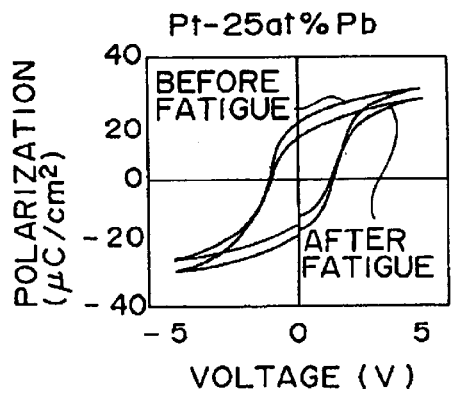

FIGS. 7(a) and 7(b) show the hysteresis curves before and after the fatigue test. In the case of the Pt top electrode for comparison (in FIG. 7(a)), the value of remanent polarization decreases by nearly half after $10^{10}$ switching cycles. By contrast, in the case of the top electrode of Pt-25 atom % Pb (Pt₃Pb) in this example (in FIG. 7(b)), the value of remanent polarization decreases only a little after $10^{10}$ switching cycles. This results from a decrease in strain in the interface between Pt₃Pb and PZT. To show this, XRD analysis was conducted.

Figure 8:
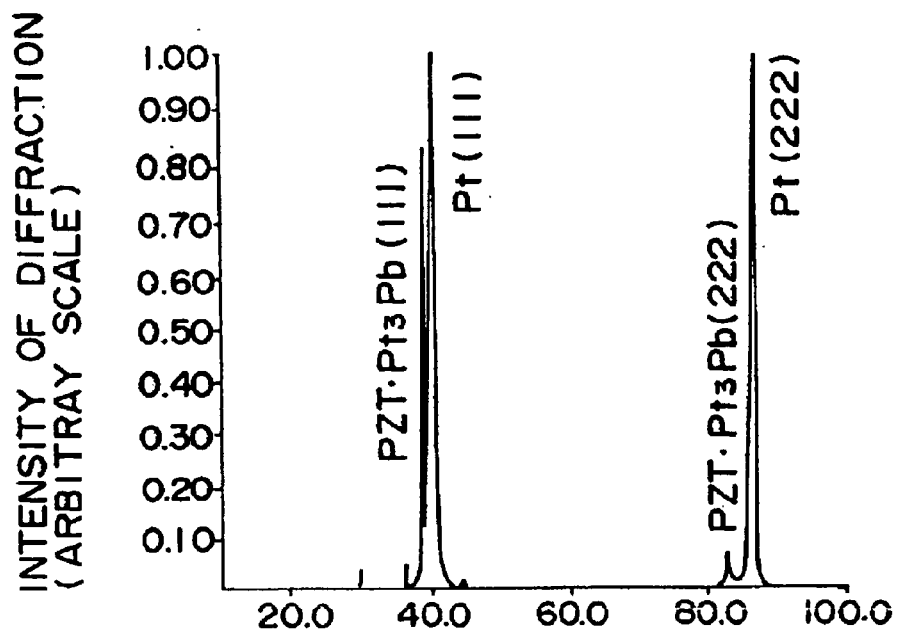
FIGS. 8(1) and 8(2) are diagrams showing the XRD diffraction pattern in one example of the present invention.
Figure 8:
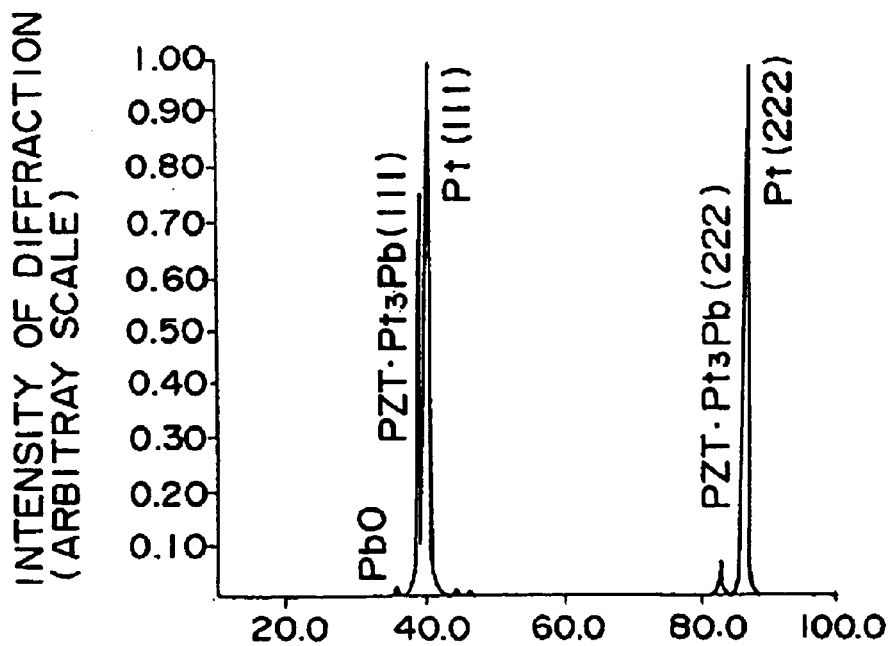

FIGS. 8(1) and 8(2) show the result of XRD analysis of the ferroelectric capacitor in this example. The diagram of FIG. 8(1) represents the result obtained after the top electrode of Pt-25 atom % Pb had been formed. The diagram of FIG. 8(2) represents the result obtained after oxygen treatment at 650° C. The top electrode analyzed is made of Pt₃Pb intermetallic compound and is formed on the PZT highly orienting in the (111) plane. It orients mainly in the (111) plane. The results of XRD analysis give peaks due to (111) and (222) corresponding to the lattice constant of 4.04 Å and peaks due to (111) and (222) corresponding to the lattice constant of 3.91 Å. The former represents PZT and Pt₃Pb, which have almost the same lattice constant. The latter represents Pt constituting the bottom electrode. This means that the top electrode of Pt₃Pb has good lattice matching with PZT. The XRD pattern obtained after oxygen treatment has a tiny peak (in the region of 2θ=20–40°) indicating the presence of PbO. However, most of the top electrode retains the lattice constant and orientation of Pt₃Pb. The fact that there is very little difference in lattice constant between the Pt₃Pb top electrode and the PZT leads to reduction in strain in the interface (due to good matching) and improvement in film fatigue characteristics.

The foregoing demonstrates that the top electrode made of Pt—Pb intermetallic compound is scarcely subject to deterioration by hydrogen and hence contributes to provision of a ferroelectric capacitor having superior film fatigue characteristics.

In this example, a mention was made of sputtering as the method of forming the PZT film. Any other method than sputtering may be employed. For example, it is possible to use spin coating, spraying, misting, MOCVD, MBE, or laser vapor deposition (in which the raw material may be an organometallic compound or an acetate).

In this example, a mention was made of dual sputtering that employs two targets of Pt and Pb as the method of forming the layer of Pt—Pb intermetallic compound. Any other method than this may be employed. For example, it is possible to use vapor deposition by electron beams or laser beams. Alternatively, it is also possible to form the layer of Pt—Pb intermetallic compound by alternately laminating a Pt thin film and a Pb thin film, followed by heat treatment. Another alternative method is implantation of Pb ions in a high vacuum after or during the formation of the Pt layer or ion-beam deposition which directly laminates Pt ions and Pb ions in a high vacuum.

EXAMPLE 2

Figure 9:
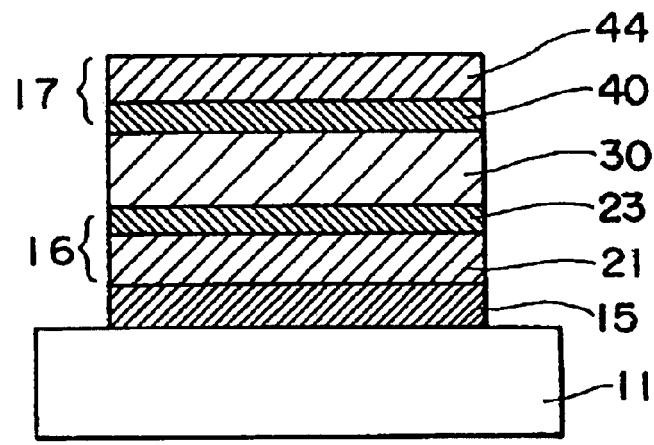
FIG. 9 is a sectional view of a ferroelectric capacitor representing one example of the present invention.

FIG. 9 is a schematic sectional view of the ferroelectric capacitor in this example. The substrate 11 and the buffer layer 15 are the same as those in Example 1. That is, the substrate 11 is a silicon wafer substrate having an SiO₂ layer formed by thermal oxidation. The buffer layer 15 is a Ti layer (200 Å thick) formed by sputtering, with the substrate heated at 300° C. In this example, the bottom electrode 16 has a double layer structure, consisting of a first layer 21 of Pt and a second layer 21 of $Pt_3Pb$ intermetallic compound having the composition of Pt-25 atom % Pb. The first layer 21 (1000 Å thick) of the bottom electrode was formed by sputtering, with the substrate heated at 300° C. The second layer 23 (1000 Å thick) of the bottom electrode was formed by sputtering, with the substrate heated at 300° C. Sputtering was carried out using a dual sputtering apparatus capable of manipulating two targets of Pt and Pb simultaneously and controlling the sputtering speeds independently for the respective targets.

The ferroelectric thin film 30 is a thin film (ca. 1000 Å thick) formed by sputtering from PZT having a composition of $Pb(Zr_{0.52}Ti_{0.48})O_3$, with the substrate kept at room temperature. The substrate with deposited layers underwent heat treatment for crystallization. This heat treatment is rapid thermal annealing (RTA) at 650° C. for 2 minutes in an atmosphere with a low oxygen concentration.

The top electrode 17 of double layer structure was formed. It is composed of a first layer 40 (adjacent to the ferroelectric layer) and a second layer 44. The first layer 40 (1000 Å thick) of the top electrode was formed from $Pt_3Pb$ in the same way as used for the second layer 23 of the bottom electrode. The second layer 44 (1000 Å) was formed from Pt by sputtering in the same way as used for the first layer 21 of the bottom electrode.

Figure 10:
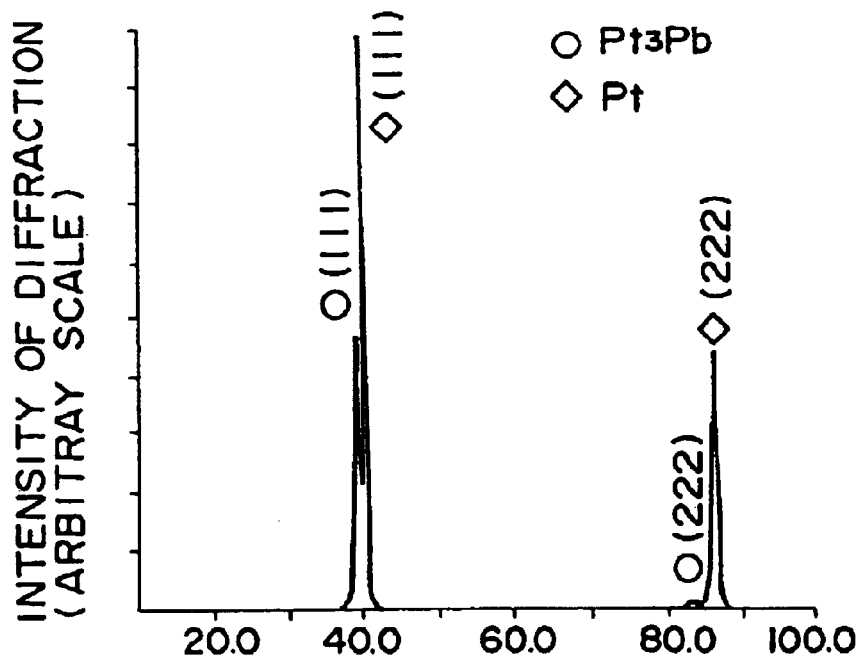
FIG. 10 is a diagram showing the XRD diffraction pattern in one example of the present invention.

FIG. 10 shows the result of XRD analysis of the ferroelectric capacitor in this example. The XRD analysis was carried out before the ferroelectric thin film 30 was formed or in the stage in which the second layer of the bottom electrode had been formed from the $Pt_3Pb$ intermetallic compound. It is noted that the layer of $Pt_3Pb$ is strongly oriented n the (111) plane under the influence of the layer of Pt which orients mainly in the (111) plane. The lattice constant of $Pt_3Pb$ is 4.03–4.04 Å and the lattice constant of Pt is 3.91 Å.

Figure 11:
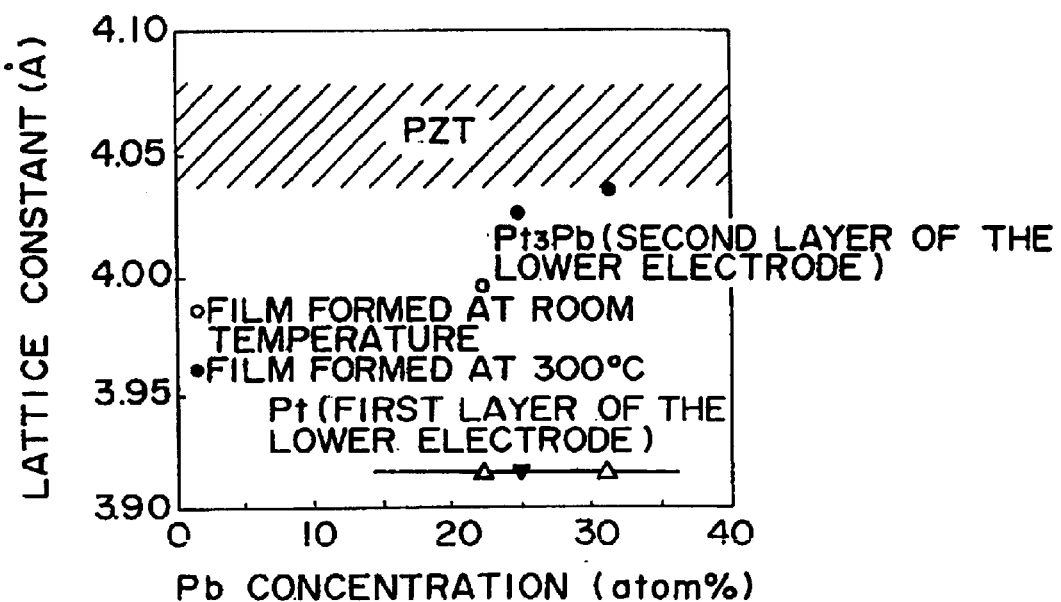
FIG. 11 is a diagram showing the lattice constant of the bottom electrode in one example of the present invention.

FIG. 11 shows the lattice constant of the second layer 23 of the bottom electrode, with the Pb content being varied. Regardless of the Pb content, the second layer 23 of the bottom electrode, which is a layer of $Pt_3Pb$ intermetallic compound, has a lattice constant which is larger than that of the first layer 21 of the bottom electrode, which is a layer of Pt. The lattice constant of the former is close to that of the ferroelectric thin film of PZT. The lattice constant of the second layer 23 of the bottom electrode or the layer of $Pt_3Pb$ intermetallic compound is indicated by the mark ○ if the layer is formed at room temperature and by the mark ● if the layer is formed at 300° C. The lattice constant of the first layer 21 of the bottom electrode or the layer of Pt is indicated by the mark △ if the layer is formed at room temperature and by the mark ▼ if the layer is formed at 300° C. The hatched area in FIG. 11 denotes the values of lattice constant of the ferroelectric thin film of PZT.

After the ferroelectric thin film 30 had been formed and the heat treatment for crystallization had been finished, the sample was analyzed by X-ray diffractometry. It was found that the ferroelectric layer of PZT strongly orients in the (111) plane and has a lattice constant of 4.04 Å.

Figure 12:
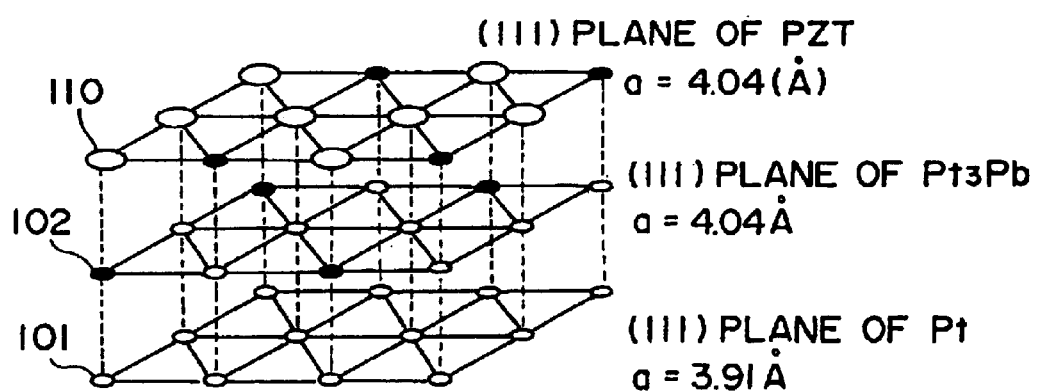
FIG. 12 is a schematic diagram showing the atom arrangement of the bottom electrode and ferroelectric thin film of the ferroelectric capacitor in one example of the present invention.

FIG. 12 is a schematic diagram showing the atom arrangement of the bottom electrode and ferroelectric thin film. All of the first layer (Pt) of the bottom electrode, the second layer ($Pt_3Pb$) of the bottom electrode, and the ferroelectric thin film of PZT strongly orient in the (111) plane, so that they take on the atom arrangement as shown in FIG. 12. In FIG. 12, the atom arrangement in each layer in the (111) plane is schematically shown. In this figure, 110 represents an oxygen atom, 102 represents a Pb atom, and 101 represents a Pt atom.

In this example, Pt, $Pt_3Pb$, and PZT have a lattice constant of 3.91 Å, 4.04 Å, and 4.04 Å, respectively. Therefore, they have a closest interatomic distance of 2.76 Å, 2.85 Å, and 2.85 Å, respectively, in the (111) plane. Since the difference in lattice constant between Pt and PZT is about 3.9%, a stress due to this difference occurs in the interface if PZT is formed directly on the bottom electrode of Pt. This stress in the interface is a cause for deterioration of the ferroelectric characteristics. On the other hand, there is substantially no difference in lattice constant between $Pt_3Pb$ and PZT; therefore, no stress occurs in the interface if the electrode in direct contact with PZT is formed from $Pt_3Pb$ as in this example.

Also, since the first layer of the top electrode is formed from $Pt_3Pb$, it is possible to prevent the polarizing characteristics from being deteriorated by hydrogen, as demonstrated in Example 1. In addition, the fact that the lattice strain is relieved in the upper and lower interfaces of the ferroelectric thin film greatly improves the fatigue characteristics, as in the case of Example 1.

In this example, the top electrode has a bilayer structure, with the first layer being $Pt_3Pb$ and the second layer being Pt. Forming the second layer of the top electrode from Pt produces the following effect. The top electrode is formed by etching after the film for the top electrode has been formed. During etching, the film of $Pt_3Pb$ may be degraded and contact between the top electrode and wiring may be deteriorated by halogen gas and resist material used for etching. The second layer of the top electrode formed from Pt protects $Pt_3Pb$ and prevents the film morphology from being deteriorated in the etching step and the ashing step that follows resist removal. In this example the second layer of the top electrode is formed from Pt; however, it may also be formed from any of W, Ta, Ir, Ru, Pd, Ni, and Cu, with the effect remaining the same.

This $Pt_3Pb$ prevents Pb from diffusing from PZT to the electrode during heat treatment for PZT crystallization. Owing to the effect of preventing Pb diffusion, together with the above-mentioned effects of reducing strain in the interface and producing a strong orientation, it is possible to prevent a degraded layer from occurring near the interface of the electrode. (This degraded layer is a cause for deterioration of polarizing characteristics.) For this reason, the ferroelectric layer of PZT can be made as thin as 800 Å in this example. This thin ferroelectric layer of PZT permits a memory to be driven at a lower voltage. In addition, the effect of preventing deterioration by hydrogen reduction protects the characteristics from being deteriorated in the interconnect process which evolves hydrogen. Therefore, the ferroelectric capacitor can be mounted on the logic having a multilevel interconnect structure.

Because of the above-mentioned effects, the ferroelectric capacitor in this example retains a low value of coercive electric field (Ec) and a large value of remanent polarization (Pr), which is less subject to deterioration by processing. The ferroelectric capacitor helps to realize a memory that can be driven, at a low voltage. In addition, the ferroelectric capacitor scarcely decreases in Pr even after plural switching cycles.

The ferroelectric capacitor mentioned above can be used as a non-volatile ferroelectric memory. It can also be used as a DRAM capacitor that utilizes a high dielectric characteristic.

EXAMPLE 3

Figure 13:
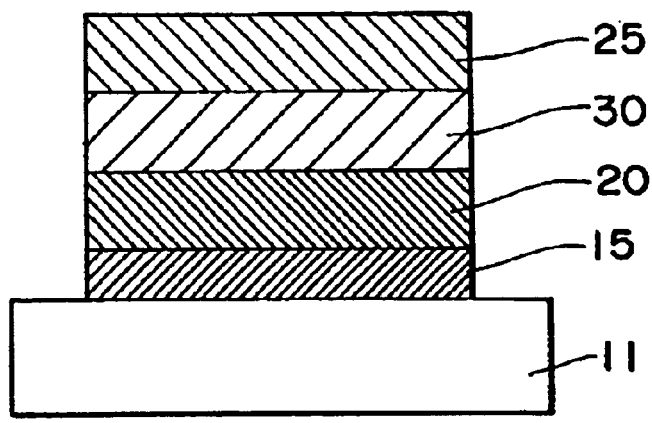
FIG. 13 is a sectional view of a ferroelectric capacitor representing one example of the present invention.

FIG. 13 is a sectional view of the ferroelectric capacitor in this example. It is composed of a top electrode 25, a ferroelectric thin film 30, a bottom electrode 20, a buffer layer 15, and a substrate 11.

The substrate 11 is a silicon wafer substrate having an $SiO_2$ layer formed by thermal oxidation. The buffer layer 15 is a Ti layer (200 Å thick) formed by sputtering, with the substrate heated at 300° C. On the buffer layer 15, there was formed by sputtering a bottom electrode 20 in the form of a thin film (1000 Å thick) of Pt—Pb intermetallic compound. This sputtering employs a sintered body of Pt-15 atom % Pb as the target. During sputtering, the substrate was heated at 300° C. The results of X-ray diffractometry indicate that the thin film of Pt—Pb intermetallic compound has a face centered cubic structure, with a lattice constant of 4.04 Å, and strongly orients in the (111) plane.

The ferroelectric thin film 30 is a thin film (ca. 1200 Å thick) formed by sputtering from PZT having a composition of $Pb(Zr_{0.52}Ti_{0.48})O_3$, with the substrate kept in the range from room temperature to 450° C. The substrate with deposited layers underwent heat treatment for crystallization. This heat treatment consisted of rapid thermal annealing (RTA) at 650° C. for 2 minutes in an atmosphere of oxygen. The top electrode 25 (1000 Å thick) was formed from Pt—Pb intermetallic compound in the same way as for the bottom electrode 20.

The resulting ferroelectric capacitor was examined by TEM-EDX analysis, SIMS analysis, and ICP analysis. It was found that there is very little diffusion of Pb from the PZT thin film into the top and bottom electrodes. It was also found that the PZT film has the desired composition and the PZT film is free from a degraded layer. It was also found that the upper and bottom electrodes are formed from the intermetallic compound of $Pt_3Pb$ having a $L1_2$ crystal structure. In this example, both the top electrode layer and the bottom electrode layer are entirely composed of the intermetallic compound. However, there may be an instance in which crystalline particles of intermetallic compound exist in part of the electrode layer. The same effect as mentioned above is also produced in this case. Therefore, this case is also within the scope of the present invention. Moreover, the results of X-ray diffractometry indicate that the PZT thin film strongly orients in the (111) plane. The reason for this is that the bottom electrode orients in the (111) plane and its lattice constant is close to that of PZT, so that epitaxial growth occurs. The lattice constant of the intermetallic compound ($Pt_3Pb$) obtained by X-ray diffractometry (peak positions) and electron beam diffraction is larger than that of Pt alone; and it is very close to that of PZT. This is evidenced by the fact that lattice strain is relieved in the interface of the bottom electrode and stress in the interface is suppressed. Since the top electrode is made of the intermetallic compound of $Pt_3Pb$, the ferroelectric capacitor has a small stress in the interface of the top electrode and has good hydrogen resistance characteristics, which is an issue when the protective insulating film is formed afterwards.

Owing to the effects mentioned above, the ferroelectric capacitor in this example retains a low level of coercive electric field (Ec) and keeps a high level of remanent polarization (Pr). It scarcely decreases in Pr even after plural switching cycles.

EXAMPLE 4

Figure 14:
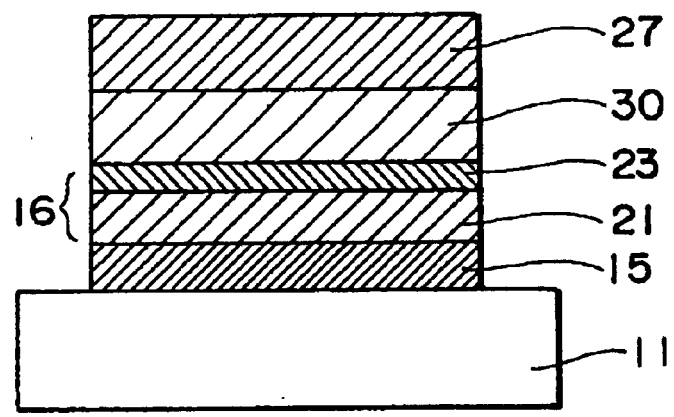
FIG. 14 is a sectional view of a ferroelectric capacitor representing one example of the present invention.
Figure 15:
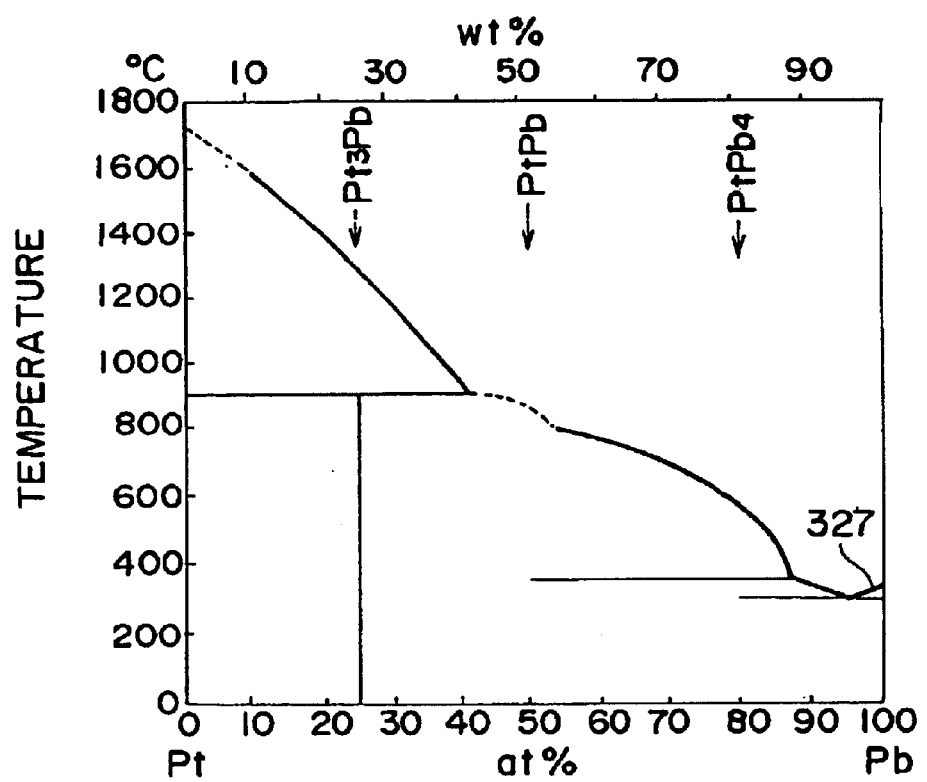
FIG. 15 is a phase diagram of the equilibrium state of the Pt—Pb binary system.
Figure 16A:
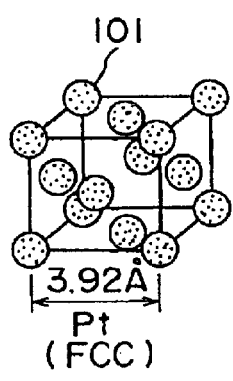
FIGS. 16(a), 16(b) and 16(c) are diagrams showing the crystal structure of Pt, Pt$_3$Pb, and PZT.
Figure 16B:
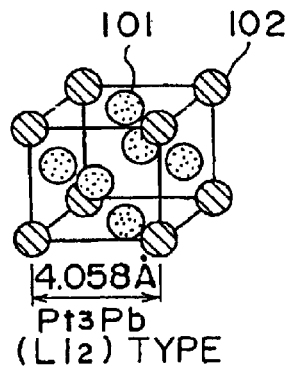
Figure 16C:
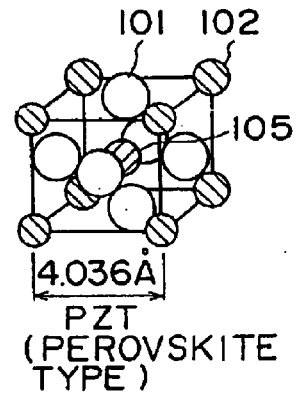

FIG. 14 is a sectional view of the ferroelectric capacitor in this example.

The substrate 11 and the buffer layer 15 are the same as those in Examples 1 to 3. In this example, the buffer layer is formed first, and then the Pt layer (1000 Å thick) is formed in the same manner as in Example 2. Subsequently, the Pb layer (100 Å thick) is formed by sputtering. The PZT film (1200 Å thick) is formed in the same way as in Example 1. Finally, heat treatment (RTA) for crystallization is carried out in oxygen at 650° C. for 2 minutes. During sputtering to form the Pt layer, the Pb layer, and the PZT layer, the substrate is kept at a constant temperature of 300° C. During the heat treatment for crystallization, Pb diffuses into the Pt layer. The bottom electrode 16 of double layer structure is formed as shown in FIG. 14. It is composed of a first layer 21 of Pt and a second layer 23 of $Pt_3Pb$ intermetallic compound. Then, the top electrode 27, which is a Pt layer (1000 Å thick), is formed by sputtering. Thus, there is obtained a desired ferroelectric capacitor.

After the bottom electrode 16 and the PZT ferroelectric thin film 30 had been formed, the sample was examined by X-ray diffractometry. It was found that they strongly orient in the (111) plane. This is because the Pt layer orients under the influence of the orientation of the Ti buffer layer 15 and the Pt layer was formed directly on the Ti buffer layer without an interlayer between them. If there exists an interlayer of another substance between the Ti buffer layer and the Pt layer, then both the bottom electrode 16 and the ferroelectric 30 will not strongly orient.

Owing to the effects mentioned above, the ferroelectric capacitor in this example retains a low level of coercive electric field (Ec) and keeps a high level of remanent polarization (Pr). It scarcely decreases in Pr even after plural switching cycles.

EXAMPLE 5

Figure 17:
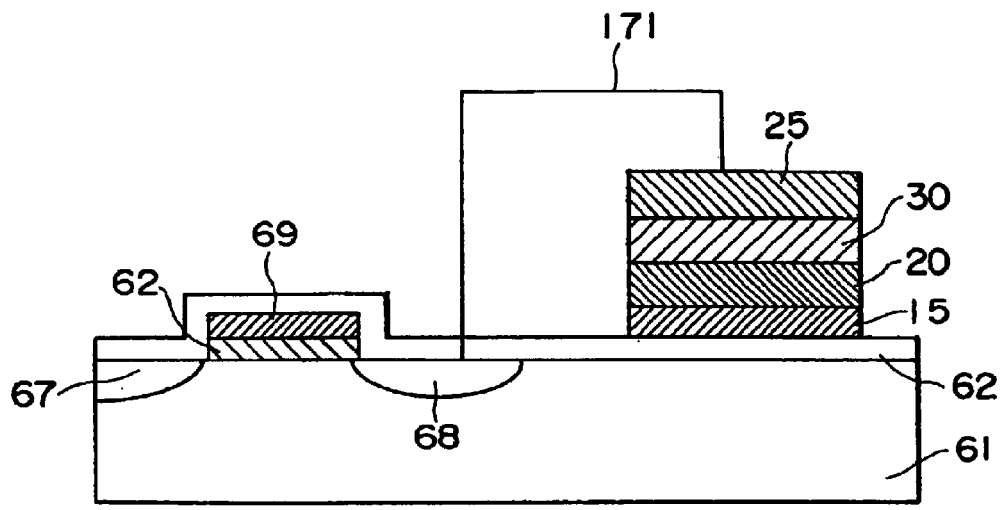
FIG. 17 is a sectional view of a ferroelectric memory representing one example of the present invention.

FIG. 17 is a schematic sectional view of the ferroelectric memory cell in this example.

This memory cell is produced in the following manner. On a silicon substrate 61, there are formed a source 67 and a drain 68. On this substrate, there is formed an $SiO_2$ layer 62 (250 Å thick) by oxidation. At the center of the substrate, there is formed a convex $SiO_2$ film by patterning through a mask. On this $SiO_2$ film, there is formed a polycrystalline silicon layer (4500 Å thick) by CVD. On the entire surface, there is formed an $SiO_2$ layer 62 (250 Å thick) by oxidation. Thus, there is obtained a MOS transistor. The capacitor corresponding to this semiconductor MOS is formed in the following manner. First, a Ti buffer layer 15 (2000 Å thick) is formed by heating at 300° C. On this buffer layer, there is formed a ferroelectric capacitor of the same structure as that produced in the foregoing Example. It is composed of a bottom electrode 20 of $Pt_3Pb$, a ferroelectric thin film 30 of PZT, and a top electrode 25 of $Pt_3Pb$. Thus, there is obtained a desired ferroelectric memory cell. The drain 68 is connected to the top electrode of $Pt_3Pb$ through a conductor 171 of aluminum or the like. (This is schematically shown in FIG. 17.) In some cases, the drain 68 may be connected to the bottom electrode of $Pt_3Pb$ through a conductor 171 of aluminum or the like. In this way, there is formed a ferroelectric memory cell of so-called 1-MOS 1-capacitor type.

The thus obtained ferroelectric memory cell gives a remanent polarization, with a polarity in the direction of voltage application, when a voltage greater than the coercive electric field is applied from the upper (or lower) electrode to the lower (or upper) electrode of the ferroelectric capacitor. If the direction of the remanent polarization is made to correspond to the state of "0" or "1", it is possible to perform writing to the memory. Also, it is possible to read out "1" or "0" by detecting the change in capacity of an accumulated charge as the hysteresis characteristics of the ferroelectric layer that is obtained by application of a voltage greater than the coercive electric field. The ferroelectric memory cell has a capacitor in which the electrode is made of the specific materials of the present invention. Therefore, the ferroelectric memory cell has a high level of polarization and deteriorates very little after repeated use.

In this example, a mention is made of a case in which the ferroelectric capacitor is used as the capacitor of a semiconductor MOS. The same effect as mentioned above will be produced also in the ferroelectric memory constructed such that the ferroelectric capacitor is formed on the gate of a semiconductor field effect transistor.

EXAMPLE 6

Figure 18:
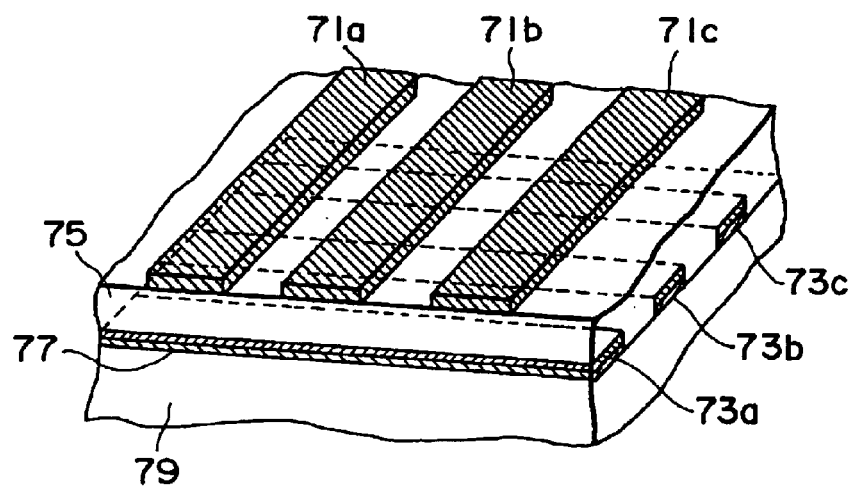
FIG. 18 is a perspective diagram showing a semiconductor device representing one example of the present invention.

FIG. 18 is a schematic diagram showing the semiconductor device provided with the ferroelectric memory cell in this example. The semiconductor device has ferroelectric capacitors (shown in Example 1) arranged two-dimensionally such that the bottom electrodes 73a, 73b, 74c, . . . and the top electrodes 71a, 71b, 71c, . . . intersect at right angles. As in Example 1, each capacitor is composed of upper and bottom electrodes of Pt—Pb intermetallic compound and the ferroelectric thin film 75 of PZT. A Ti buffer layer 77 is formed between the substrate 79 and the bottom electrodes 73a, 73b . . . .

Of the two-dimensionally arranged ferroelectric capacitors, one cell is selected by selecting one from the top electrodes and one from the bottom electrodes by means of the access circuit. One transistor (not shown) near the capacitor is driven so as to apply a voltage for writing or reading. The memory cell functions in this way.

EXAMPLE 7

Figure 19:
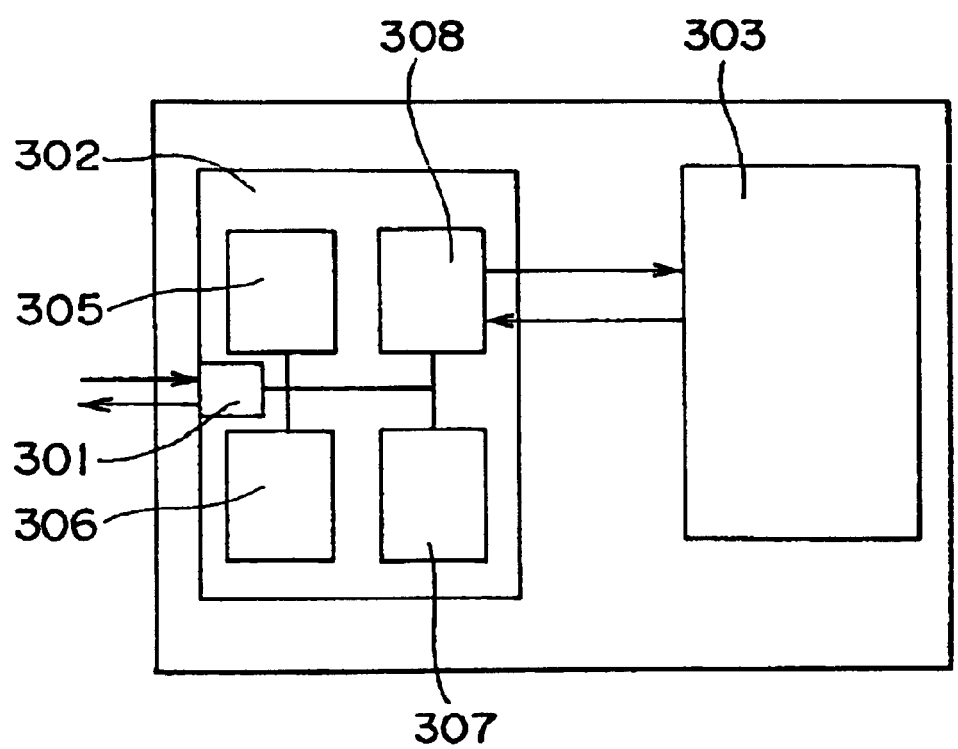
FIG. 19 a block diagram showing a system LSI representing one example of the present invention.

FIG. 19 a conceptual diagram showing a system LSI provided with the ferroelectric memory cell in this example. One-chip logic is composed of an external interface 301, a CPU 302, and a ferroelectric memory 303. The CPU 302 is composed of an address unit 305, an execution unit 306, an order unit 307, and a bus unit 308. The CPU 302 exchanges information with the ferroelectric memory 303 through the bus unit 308. The system LSI exchanges data with an external information machine (not shown) through the external interface 301. Date communications may be accomplished through interconnects or by electric wave or infrared rays without interconnects. The ferroelectric memory 303 previously required a ROM (to store programs) and a RAM (to write and read data randomly). Conventionally, the ROM is a EPROM and the RAM is a DRAM. In other words, more than one kind of memory is required. By contrast, in this example, the ferroelectric memory 303 alone constitutes the necessary unit. The ferroelectric memory is non-volatile and is capable of high-speed writing and reading. Therefore, it functions as both a ROM and a RAM. Constituting the memory unit with the ferroelectric memory alone makes it possible to allocate the region for the ROM and the RAM as desired. This ferroelectric memory element has the capacitor structure as shown in Example 1. It has the top electrode of $Pt_3Pb$; therefore, it is scarcely subject to deterioration by hydrogen and is superior in film fatigue characteristics. Even though the interconnect process is repeated twice or more after the ferroelectric capacitor has been formed, the resulting ferroelectric memory in the system LSI does not deteriorate in polarizing characteristics.

EXAMPLE 8

Figure 20:
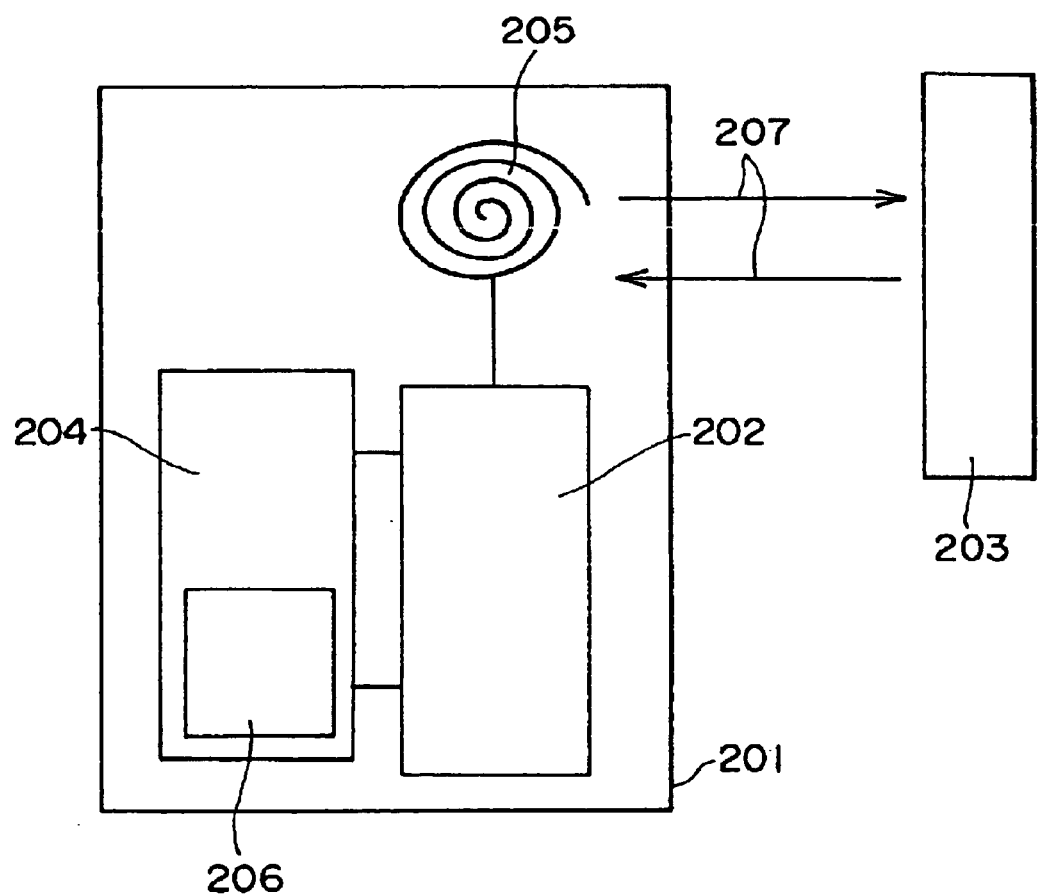
FIG. 20 a conceptual diagram showing a contactless IC card representing one example of the present invention.

FIG. 20 a conceptual diagram showing a contactless type IC card provided with the ferroelectric memory cell in this example. The contactless type IC card 201 is composed of a transmitting and receiving device 202, a microcomputer chip with built-in memory 204, and an antenna coil 205. The antenna coil 205 receives electric waves (containing data 207) sent from an external data conversion unit 203. The received electric waves are converted into a voltage, which in turn drives the microcomputer chip 204 through the transmitting and receiving unit 202. The data 207 is sent to the external data conversion unit 203 in the opposite direction. The microcomputer chip 204 is provided with the ferroelectric memory unit 206 of the present invention. In this example, the ferroelectric memory element 206 is one in which the ferroelectric thin film of PZT has a thickness of 1000 Å or less, so that it can be driven at a lower voltage.

As mentioned above, if the top electrode is made of a Pt—Pb intermetallic compound, it is possible to protect PZT from being deteriorated by hydrogen. Therefore, it is possible to provide a ferroelectric memory which is not subject to deterioration in polarizing characteristics. It is also possible to provide a ferroelectric memory which has a low strain in the interface between the PZT and the electrode and which is less subject to deterioration due to repeated polarization and inversion. Also, if the bottom electrode is made of a Pt—Pb intermetallic compound, it is possible to greatly reduce the diffusion of Pb from PZT to the electrode and hence it is possible to prevent the formation of a degraded layer in the ferroelectric thin film. As in the case of the top electrode, it is possible to form an interface which is almost free from strain. Therefore, it is possible to form PZT with high orientation which is less vulnerable to deterioration due to plural switching cycles. Thus, it is possible to provide a ferroelectric memory having superior polarizing characteristics.

According to the present invention, it is possible to prevent the formation of a degraded layer in the ferroelectric thin film of the ferroelectric memory. Also, according to the present invention, it is possible to provide an electrode material which lowers stress in the interface between the ferroelectric thin film and the electrode. Further, according to the present invention, it is possible to produce a ferroelectric memory which has a high level of polarization and is less vulnerable to deterioration due to repeated use.

The present invention can be applied to a ferroelectric memory, particularly a non-volatile ferroelectric memory (FeRAM), a system LSI provided with a non-volatile memory, a semiconductor device typified by a DRAM in which the ferroelectric is used as a capacitor, and electronic machines and equipment, such as an IC card, which is provided with said devices.

What is claimed is:

1. A ferroelectric capacitor of the type having a top electrode, a ferroelectric thin film, and a bottom electrode, characterized in that said ferroelectric thin film is a perovskite-type oxide containing a metal element, and at least either of said top electrode or said bottom electrode has a multilayer structure formed by sequentially laminating a layer containing an intermetallic compound composed of said metal element and a noble metal and a layer of said noble metal, the former being adjacent to the interface of the ferroelectric thin film.

2. A ferroelectric capacitor as defined in claim 1, in which said noble metal is Pt, said intermetallic compound is one which is composed of Pb and Pt, with the Pb content being 50 atom % or less, and said ferroelectric capacitor further having a buffer layer comprised of Ti.

3. A ferroelectric capacitor as defined in claim 1, in which said intermetallic compound is one which has a $L1_2$ type crystal structure represented by the composition formula of $Pt_3Pb$.

4. A ferroelectric capacitor as defined in claim 1, in which said intermetallic compound is one which has a crystal structure based on a face centered cubic lattice.

5. A ferroelectric capacitor as defined in claim 1, in which said bottom electrode has a crystal structure based on a face centered cubic lattice and orients mainly in the (111) plane, (100) plane, or (110) plane.

6. A ferroelectric capacitor as defined in claim 1, in which both said ferroelectric thin film and said bottom electrode orient mainly in the (111) plane, (100) plane, or (110) plane.

7. A ferroelectric capacitor as defined in claim 1, in which said ferroelectric thin film has a thickness of 1000 Å or less.

8. A ferroelectric memory cell in which the ferroelectric capacitor defined in claim 1 formed on the gate of a semiconductor field effect transistor.

9. A semiconductor device which has the ferroelectric memory cell defined in claim 8.

10. A system LSI which has the ferroelectric memory cell defined in claim 8.

11. An IC card which has the ferroelectric memory cell defined in claim 8.

12. A ferroelectric memory cell in which the ferroelectric capacitor defined in claim 1, is formed as the capacitor of the semiconductor MOS part.

13. A semiconductor device comprised of the ferroelectric memory cell defined in claim 12.

14. A system LSI comprised of the memory cell defined in claim 12.

15. An IC card comprised of the ferroelectric memory cell defined in claim 12.

16. A ferroelectric capacitor of the type having a top electrode, a ferroelectric thin film, and a bottom electrode, characterized in that said bottom electrode is of double layer structure composed of a first layer of metal having a face centered cubic lattice and a second layer of an alloy containing said metal, and the difference in lattice constant between said first layer and said second layer is 3.5% or less.

17. A method of forming a ferroelectric capacitor forming a buffer layer on a substrate, said buffer layer being comprised of a transition metal or a nitride thereof;

forming a bottom electrode on said buffer layer, wherein said bottom electrode includes an intermetallic compound comprised of a metal element and a noble metal;

forming a ferroelectric thin film on said bottom electrode, wherein said ferroelectric thin film is comprised of a perovskite-type oxide containing said metal element, and forming a top electrode on said ferroelectric thin film, wherein said top electrode is formed as a multilayer structure by sequentially laminating a layer containing an intermetallic compound comprised of said metal element and a noble metal and a layer of said noble metal, the former being adjacent to the interface of the ferroelectric thin film.

* * * * *